United States Patent
Yamashita et al.

(10) Patent No.: US 7,041,535 B2
(45) Date of Patent: May 9, 2006

(54) POWER MODULE AND METHOD OF MANUFACTURING THE SAME

(75) Inventors: Yoshihisa Yamashita, Kyoto (JP); Koichi Hirano, Osaka (JP); Seiichi Nakatani, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 161 days.

(21) Appl. No.: 10/758,517

(22) Filed: Jan. 14, 2004

(65) Prior Publication Data

US 2004/0145046 A1    Jul. 29, 2004

Related U.S. Application Data

(62) Division of application No. 10/160,353, filed on May 30, 2002, now Pat. No. 6,707,671.

(30) Foreign Application Priority Data

May 31, 2001    (JP) .............................. 2001-165048

(51) Int. Cl.
    *H01L 21/44*    (2006.01)
(52) U.S. Cl. ...................... 438/122; 438/118; 438/124; 438/126; 438/127
(58) Field of Classification Search ................ 438/118, 438/119, 121, 122, 124, 125, 126, 127
See application file for complete search history.

(56) References Cited

U.S. PATENT DOCUMENTS

| | | |
|---|---|---|
| 5,002,818 A | 3/1991 | Licari et al. |
| 5,396,403 A | 3/1995 | Patel |
| 5,471,366 A | 11/1995 | Ozawa |
| 5,710,733 A | 1/1998 | Chengson et al. |
| 5,866,943 A | 2/1999 | Mertol |
| 5,900,312 A | 5/1999 | Sylvester |
| 6,011,697 A | 1/2000 | Budnaitis et al. |
| 6,060,150 A | 5/2000 | Nakatani et al. |
| 6,212,074 B1 | 4/2001 | Gonsalves et al. |
| 6,275,381 B1 | 8/2001 | Edwards et al. |
| 6,285,078 B1 | 9/2001 | Nelson |
| 6,348,679 B1 | 2/2002 | Ryan et al. |
| 6,496,373 B1 * | 12/2002 | Chung .................... 361/705 |

* cited by examiner

*Primary Examiner*—Kevin M. Picardat
(74) *Attorney, Agent, or Firm*—Hamre, Schumann, Mueller & Larson, P.C.

(57) ABSTRACT

In a power module, a wiring substrate to which a heat generating component is connected electrically and a heat sink are connected through the medium of a thermally conductive and electrically insulating member. The thermally conductive and electrically insulating member is a curable composition containing (A) a thermosetting resin, (B) a thermoplastic resin, (C) a latent curing agent, and (D) an inorganic filler. The thermally conductive and electrically insulating member is bonded to the heat generating component in such a manner as to be deformed complementarily to unevenness in shape and height of the heat generating component. Heat generated from the heat generating component is radiated by means of the heat sink. Thus, a power module that allows heat generated from an electronic component to be radiated evenly and efficiently and achieves high-density mounting, and a method of manufacturing the power module are provided.

12 Claims, 8 Drawing Sheets

POWER MODULE AND METHOD OF MANUFACTURING THE SAME

This application is a Division of application Ser. No. 10/160,353 filed May 30, 2002 now U.S. Pat. No. 6,707,671.

BACKGROUND OF THE INVENTION

1. Field of the Invention

The present invention relates to a power module that houses highly exothermic electronic components such as a power semiconductor device and is used for power conversion or the like, and a method of manufacturing the power module.

2. Related Background Art

In recent years, electronic equipment has been requested to be capable of high performance and reduced in size. Accordingly, a power supply circuit in the field of power electronics, which is used in the electronic equipment, also has been requested to be downsized and have reduced energy consumption. This has raised an important problem of a heat radiating structure of a power module.

As a method of improving heat radiation of a power module, a heat sink is mounted to an electronic component generating a large amount of heat such as a semiconductor chip so that the heat is radiated from the heat sink. Thermal contact between the heat generating component and the heat sink is maintained through an insulative and thermally conductive member. An example of such a member is thermally conductive grease. However, the thermally conductive grease is not easy to handle, and the degree of thermal contact depends on how the grease is applied. Therefore, a method has been employed recently, in which the heat generating component and the heat sink are brought into contact with each other by being fixed in a state where a thermally conductive elastic sheet is interposed between and pressed by the heat generating component and the heat sink.

As another method of improving heat radiation of a power module, a method has been employed in which a substrate having an excellent thermal conduction property is used, and a heat generating component is mounted on the substrate so that heat is radiated from the substrate. An example of such a substrate for heat radiation is a substrate formed by bonding a copper plate to a surface of a ceramic substrate of, for example, aluminum oxide, aluminum nitride, or the like. However, this substrate has presented a problem of a cost increase. Therefore, in applications requiring relatively low power, generally, a metallic base substrate is used in which a wiring pattern is formed on one face of a heat sink of aluminum or the like through the medium of an insulating layer. However, in the metallic base substrate, in order to enhance thermal conduction, an insulating material is required to be thin. Thus, the metallic base substrate has presented problems of influence of noise exerted between metallic bases and low dielectric strength.

As described above, in the ceramic substrate and the metallic base substrate, it is difficult to achieve both high performance and cost reduction at the same time. As a solution to this, a substrate has been proposed in which a lead frame is formed on a surface of a substrate formed by dispersing an inorganic filler in a thermoplastic resin. However, this substrate is formed in such a manner that the thermoplastic resin and the inorganic filler are melted and kneaded to be molded by injection, and thus it is difficult to attain the high concentration of the inorganic filler, thereby presenting a limit to the enhancement of a thermal conduction property. Furthermore, a method has been proposed (JP10(1998)-173097 A) that employs a substrate on which a lead frame is formed on a surface of a substrate formed by dispersing an inorganic filler in a thermosetting resin composition. This substrate is formed in such a manner that a sheet-like material containing a thermosetting resin and the inorganic filler, which exhibits flexibility in an uncured state, and the lead frame are laminated, and then the sheet-like material is cured. In this method, it is possible to attain the high concentration of the inorganic filler, thereby realizing an excellent thermal conduction property.

These substrates for heat radiation employ one-sided wiring formed on a single layer, and thus it is extremely difficult to form microscopic wiring. In a power module such as an inverter, a power circuit portion including heat generating components is mounted on any of these substrates for heat radiation, and a control circuit portion that is composed of components relatively less exothermic such as a driving circuit and a protective circuit and requires microscopic wiring is provided on a control substrate formed of a printed wiring board. The control substrate is fabricated separately from the substrate for heat radiation on which the power circuit portion is formed and connected electrically to the substrate for heat radiation. For example, on a surface of the substrate for heat radiation, on which the components are mounted, the control substrate is disposed at a predetermined space so as to be opposed to the substrate for heat radiation and fixed for packaging.

A power module using the thermally conductive elastic sheet or the substrate for heat radiation described above has presented the following problems.

The thermally conductive elastic sheet is thin, thereby having the disadvantage of low dielectric strength. Further, when a plurality of the heat generating components and one heat sink are brought into thermal contact with each other through the medium of the elastic sheet, it becomes necessary to allow variations in height of the heat generating components mounted on a substrate ascribable to unevenness in height, dimensional tolerances, and variations in mounting posture with respect to the substrate to be absorbed by deformation of the elastic sheet caused by pressing. The thin elastic sheet has a limit to the capability of absorbing variations in height of the components, and thus when there is a wide range of variations, the degree to which the elastic sheet and the heat generating components are in contact with each other cannot be maintained evenly, which is disadvantageous. Moreover, stress caused by the elastic sheet being pressed against the heat generating components with an excessively large force results in damages to the heat generating components and the occurrence of cracks in the elastic sheet, which also is disadvantageous.

A power module using the substrate for heat radiation has presented the following problem. That is, with respect to a heat generating component requiring heat radiation, when an increased number of connecting terminals are used and a pitch between electrodes is narrow, microscopic wiring is required. However, the substrate for heat radiation employs the one-sided wiring formed on the single layer, thereby making it difficult to achieve high-density mounting. On the other hand, when this heat generating component is mounted on the control substrate that allows microscopic wiring but has a poor thermal conduction property, heat radiation is hindered. Thus, the substrate for heat radiation has the disadvantage of being unsuitable for the heat generating component requiring both microscopic wiring and heat radiation to be achieved.

Furthermore, as methods of mounting a semiconductor chip, generally, a wire bonding method and a flip chip mounting method are known. In the flip chip mounting method, a semiconductor chip is mounted facedown on a substrate so that a surface of the substrate and a surface of the semiconductor chip (an electrode-forming surface) are opposed to each other. The flip chip mounting method allows higher-density mounting than in the wire bonding method. However, in a power module using the substrate for heat radiation, it is necessary to allow heat to be radiated from the substrate, and thus when the flip chip mounting method is employed, heat radiation hardly can be expected to be improved. Therefore, in this case, the semiconductor chip as a heat generating component is mounted on the substrate for heat radiation so that a rear surface of the semiconductor chip (a surface opposite the electrode-forming surface) is brought into contact with the surface of the substrate, thereby allowing heat to be radiated from the substrate. Thus, the wire bonding method is employed in which an electrode of a semiconductor chip and an electrode on the substrate for heat radiation are connected using a thin metallic wire. However, in the wire bonding method, the thin metallic wire has a considerably high conductor resistance compared with an on-state resistance of a semiconductor element, and thus when the semiconductor chip is mounted by the wire bonding method, power loss is increased, and an increased amount of heat is generated. Thus, the power module using the substrate for heat radiation has presented the following problem. Since the highly exothermic semiconductor chip is mounted by the wire bonding method, heat radiation needs to be enhanced further with respect to the substrate.

SUMMARY OF THE INVENTION

With the foregoing in mind, it is an object of the present invention to provide a power module that allows both microscopic wiring required for a heat generating component including a large number of connecting terminals and excellent heat radiation and provides suitability for high-density mounting and size reduction, and a method of manufacturing the power module.

In order to achieve the aforementioned object, a power module of a first configuration according to the present invention is a power module in which a heat generating component connected electrically to a wiring substrate is connected to a heat sink through the medium of a thermally conductive and electrically insulating member. The thermally conductive and electrically insulating member is a curable composition containing (A) a thermosetting resin, (B) a thermoplastic resin, (C) a latent curing agent, and (D) an inorganic filler. The thermally conductive and electrically insulating member is bonded to the heat generating component in a complementary state to unevenness in shape and height of the heat generating component, and heat generated from the heat generating component is radiated by means of the heat sink.

A power module of a second configuration according to the present invention includes metallic balls provided on a surface of a semiconductor chip, a wiring substrate provided on the metallic balls, and a heat spreader provided closely on an entire rear surface of the semiconductor chip so that heat is radiated from a side of the heat spreader. An electric current flows in a thickness direction of the semiconductor chip. The power module further includes an extraction electrode for electrically connecting the heat spreader to the wiring substrate. The semiconductor chip, the metallic balls on the surface of the semiconductor chip, and the extraction electrode that are interposed between the wiring substrate and the heat spreader are encapsulated with resin.

A method of manufacturing a power module according to the present invention includes the steps of mounting electronic components including at least a heat generating component on a wiring substrate; forming a curable composition layer containing (A) a thermosetting resin, (B) a thermoplastic resin, (C) a latent curing agent, and (D) an inorganic filler between a heat sink and the wiring substrate on a side of the heat generating component and pressing at least one of the heat sink and the wiring substrate against the other so that a thermally conductive and electrically insulating member is bonded in such a manner as to be deformed complementarily to unevenness in shape and height of the heat generating component; and forming the thermally conductive and electrically insulating member by allowing the curable composition layer to be cured by heating.

DETAILED DESCRIPTION OF THE INVENTION

Figure 1:
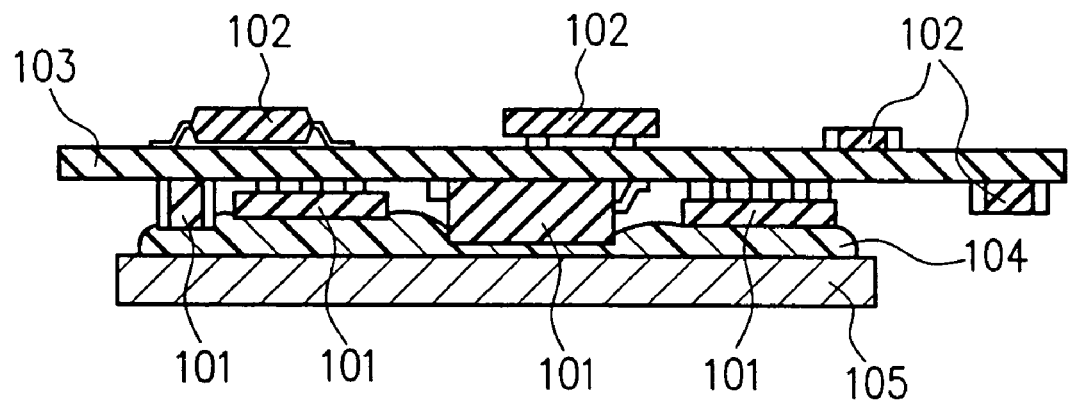
FIG. 1 is a cross-sectional view of a power module according to Embodiment 1 of the present invention.

According to the present invention, heat generating components can be mounted with high density on a wiring substrate on which microscopic wiring is formed, and heat generated from the heat generating components is radiated immediately from a heat sink through a thermally conductive and electrically insulating member bonded to the heat generating component and the heat sink. Moreover, the thermally conductive and electrically insulating member is deformed complementarily so as to absorb unevenness in height, dimensional tolerances, and variations in mounting posture with respect to the wiring substrate of the heat generating components mounted on the wiring substrate, and thus heat generated from each of the heat generating components can be radiated evenly and efficiently regardless of variations in height of the components. Further, the thermally conductive and electrically insulating member is bonded to the heat generating component and the heat sink, thereby providing a low contact thermal resistance and high heat radiation efficiency. In addition, the thermally conductive and electrically insulating member is bonded by itself, and thus the need for an external force for bonding the member to the heat generating component is eliminated, thereby providing a structure free from stress with respect to the heat generating components.

Preferably, with respect to a total amount of 100 parts by mass of a combination of (A) the thermosetting resin of not less than 50 parts and not more than 95 parts and (C) the latent curing agent of not less than 5 parts and not more than 50 parts, (B) the thermoplastic resin is contained in an amount of not less than 10 parts and not more than 100 parts, and with respect to a total amount of not less than 5 parts by mass and not more than 30 parts by mass of a combination of (A) the thermosetting resin, (B) the thermoplastic resin, and (C) the latent curing agent, (D) the inorganic filler is contained in an amount of not less than 70 parts and not more than 95 parts.

Preferably, the thermosetting resin is in a liquid state at room temperature, and the thermoplastic resin is in a powdery state when the thermosetting resin is in an uncured state.

Preferably, an insulative resin constituting a thermally conductive resin composition contains the thermosetting resin that is in the liquid state at room temperature as a main component and at least the thermoplastic resin and the latent curing agent, and in the insulative resin in an uncured state, the thermoplastic resin is a thermoplastic resin power. In this composition, the thermoplastic resin powder is swelled by absorbing a liquid component, so that the composition can be increased in viscosity in an uncured state to be solidified irreversibly. Further, the composition can be cured by being heated to a temperature equal to or higher than an activation temperature of the latent curing agent.

As the thermosetting resin that is in the liquid state at room temperature, various types of resins including a liquid epoxy resin and a liquid phenolic resin can be used. In the present invention, it is particularly preferable to use the liquid epoxy resin in terms of heat resistance and an electrical insulation property. The liquid epoxy resins that can be used include a bisphenol A type epoxy resin, a bisphenol F type epoxy resin, a bisphenol AD type epoxy resin, and a phenol novolak type epoxy resin.

There is no particular limit to the latent curing agent. The latent curing agent can be selected depending on a type of the thermosetting resin that is used, and the known latent curing agents can be used. With respect to the liquid epoxy resin, a curing agent of, for example, dicyandiamide, urea, organic acid hydrazide, polyamine salt, amineadduct, or the like can be used.

There is no particular limit to the thermoplastic resin powder as long as the thermoplastic resin powder has the property of being swelled by absorbing the liquid component contained in the insulative resin mainly containing the liquid thermosetting resin. The thermoplastic resin powder is selected depending on a type of the thermosetting resin that is used so as to be swelled with respect to the thermosetting resin. With respect to the liquid epoxy resin, preferable choices are poly (vinyl chloride), poly (methyl methacrylate), polyethylene, and polyamide. Desirably, the thermoplastic resin powder has an average particle diameter of 1 to 100 μm. In the insulative resin, the thermoplastic resin powder is contained in an amount sufficient to absorb the flowing liquid component freely and allow a mixture of the materials to be solidified substantially. Generally, with respect to 100 parts by mass of the liquid thermosetting resin, the thermoplastic resin powder is contained in an amount of 10 to 100 parts by mass, and preferably 20 to 60 parts by mass. Swelling of the thermoplastic resin powder with respect to the liquid component is accelerated by a heat treatment. The heat treatment is performed at a temperature equal to or higher than a softening point and lower than a melting point of the thermoplastic resin powder. In this case, desirably, the heat treatment is performed at a temperature equal to or lower than a curing temperature of the thermosetting resin contained in the insulative resin so that the thermosetting resin is maintained at least at a reaction stage in which the thermosetting resin is cured not more than partially, and the temperature is in a range of 70 to 110° C. The heat treatment is performed for a time sufficient to allow the insulative resin to be solidified substantially.

Preferably, the inorganic filler constituting the thermally conductive resin composition is at least one selected from the group consisting of fillers excellent in thermal conduction property including $Al_2O_3$, $MgO$, $BN$, $SiO_2$, $SiC$, $Si_3N_4$, and $AlN$. An average particle diameter of the inorganic filler falls, suitably, within a range of 0.1 to 100 μm, and preferably, within a range of 7 to 12 μm.

Suitably, in the thermally conductive resin composition, when an amount of the whole thermally conductive resin composition is assumed to be 100 parts by mass, the insulative resin is contained in an amount of 5 to 30 parts, preferably 7 to 15 parts, and more preferably 9 to 12 parts, and the inorganic filler is contained in an amount of 70 to 95 parts, preferably 86 to 93 parts, and more preferably 89 to 93 parts. This allows the thermally conductive and electrically insulating member as a cured body of the thermally conductive resin composition to have an excellent thermal conduction property.

Furthermore, preferably, the thermally conductive resin composition contains additives such as a coupling agent, a dispersing agent, a coloring agent, and a mold release agent as required. Use of the various additives allows the property of an insulating layer to be improved. For example, the coupling agent improves the adhesion between the inorganic filler and the insulative resin, thereby being effective in enhancing a dielectric strength. Further, the dispersing agent improves the dispersibility of the inorganic filler, thereby being effective in reducing composition unevenness in the thermally conductive and electrically insulating member. Further, as for the coloring agent, for example, a black coloring agent such as a carbon powder is effective in improving a heat dissipation property.

Figure 10:
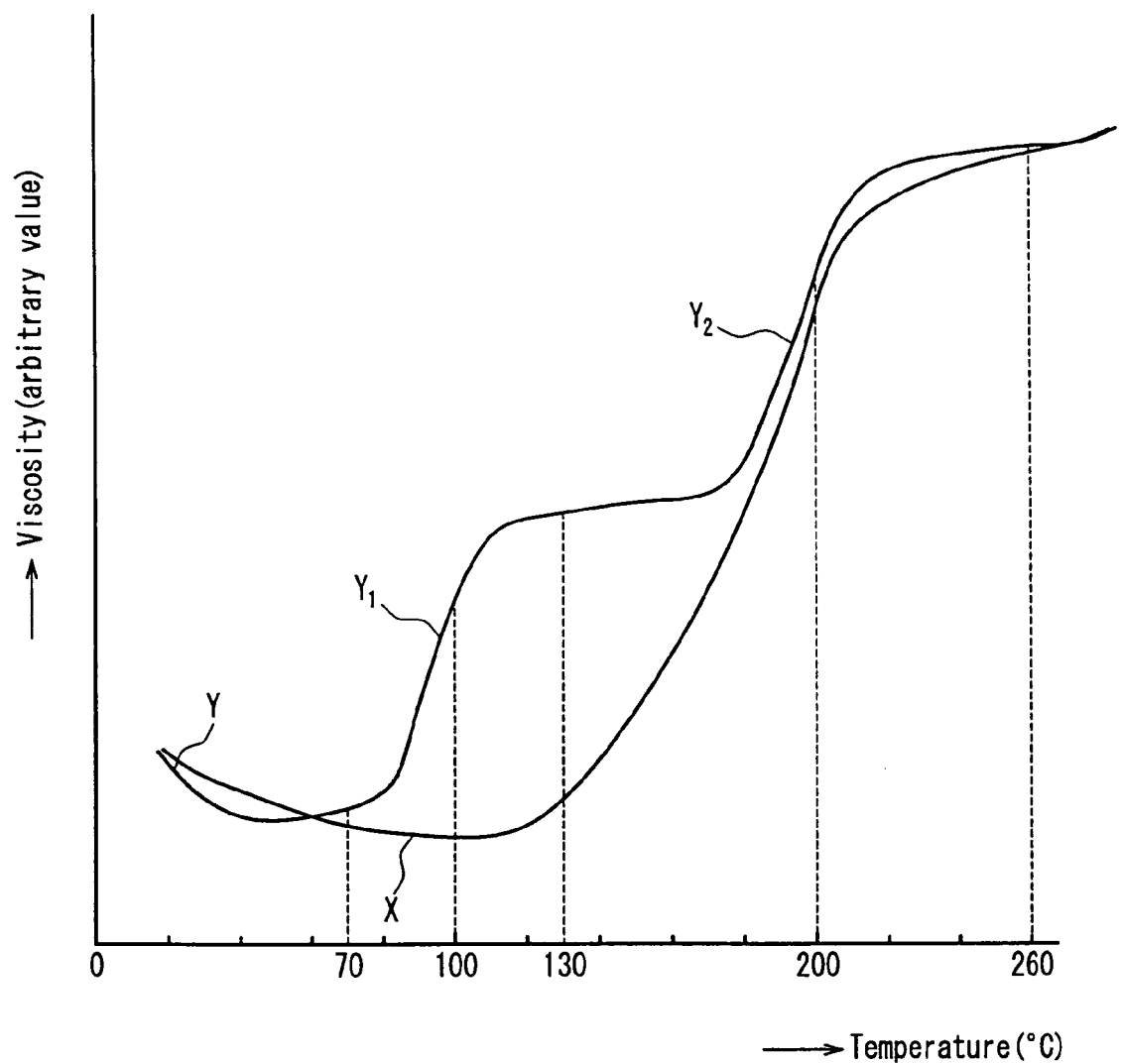
FIG. 10 is a graph showing a viscosity property of a curable resin composition in an example of the present invention.

Preferably, the curable composition containing (A) the thermosetting resin, (B) the thermoplastic resin, (C) the latent curing agent, and (D) the inorganic filler has the property that the viscosity increases steeply in two stages represented by: a first viscosity increasing curve with respect to temperatures equal to or higher than 70° C. and lower than 130° C.; and a second viscosity increasing curve with respect to temperatures equal to or higher than 130° C. In the following, this will be explained with reference to FIG. 10. In FIG. 10, a curve X shows a temperature and a viscosity property of a conventional composition of the thermosetting resin and the curing agent. At a temperature equal to or higher than about 100° C., the viscosity increases simply and gradually with increasing temperature.

In contrast to this, in the composition according to the present invention, the viscosity increases as represented by a curve Y. At temperatures equal to or higher than 70° C. and lower than 130° C., the viscosity increases as represented by a first steep viscosity increasing curve $Y_1$, and further, at temperatures equal to or higher than 130° C. and equal to or lower than 220° C., the viscosity increases as represented by a second steep viscosity increasing curve $Y_2$. The first viscosity increasing curve $Y_1$ is formed because the thermoplastic resin is added. At temperatures equal to or higher than 70° C. and lower than 130° C., the thermoplastic resin absorbs the liquid component, and thus the viscosity is increased abruptly. The second viscosity increasing curve $Y_2$ is formed because the latent curing agent is added. At temperatures equal to or higher than 130° C. and equal to or lower than 220° C., a curing reaction progresses abruptly, and thus the viscosity is increased.

In the power module, desirably, the thermally conductive and electrically insulating member is bonded to a plurality of the heat generating components, and the plurality of the heat generating components are connected thermally to the heat sink through the medium of the common thermally conductive and electrically insulating member. This eliminates the need to dispose the thermally conductive and electrically insulating members with respect to each of the heat generating components, thereby allowing a manufacturing process to be made easier.

Furthermore, in the power module, desirably, a non-heat generating component further is mounted on the wiring substrate on which the heat generating component is mounted. This allows a power circuit portion including the heat generating component and a control circuit portion including the non-heat generating component to be integrated so as to be mounted with high density on the same wiring substrate, thereby allowing the power module to be reduced further in size.

In this case, desirably, the heat generating component is mounted on one main surface of the wiring substrate, and the non-heat generating component is mounted on a surface opposite the one main surface. According to this configuration, even when the non-heat generating component of the control circuit portion is extremely susceptible to heat, the function of the non-heat generating component is not impaired by heat from the heat generating component of the power circuit portion, and the control circuit portion and the power circuit portion can be integrated.

Furthermore, in the power module, desirably, the thermally conductive and electrically insulating member is the cured body of the thermally conductive resin composition composed of 5 to 30% by mass of the insulative resin and 70 to 95% by mass of the inorganic filler. This allows the thermally conductive and electrically insulating member to have an excellent thermal conduction property, thereby allowing heat radiation to be enhanced more reliably.

Furthermore, in the power module, desirably, the insulative resin contains at least the thermosetting resin that is in the liquid state at room temperature in the uncured state, the thermoplastic resin, and the latent curing agent, and in the insulative resin in the uncured state, the thermoplastic resin is the thermoplastic resin powder. Accordingly, the thermally conductive and electrically insulating member is bonded to the heat generating component and the heat sink as the thermosetting resin in a cured form, thereby allowing contact thermal resistance to be reduced. Further, the heat sink can be fixed to the heat generating component without using a complicated fixing tool. In this composition, under the heat treatment, the thermoplastic resin powder is swelled by absorbing the liquid component, so that the composition can be increased in viscosity in an uncured state to be solidified irreversibly. The composition can be cured by being heated further. Generally, the room temperature is assumed to be 20° C.

In this case, desirably, the thermosetting resin that is in the liquid state at room temperature is a liquid epoxy resin. This is desirable because the liquid epoxy resin is excellent in heat resistance and an electrical insulation property.

Furthermore, in the power module, desirably, the inorganic filler is at least one selected from the group consisting of $Al_2O_3$, $MgO$, $BN$, $SiO_2$, $SiC$, $Si_3N_4$, and $AiN$. This is desirable because these inorganic fillers are excellent in thermal conduction property, thereby being particularly effective in improving the thermal conductivity of the thermally conductive and electrically insulating member.

Furthermore, in the power module, desirably, the thermally conductive and electrically insulating member has a thermal conductivity of 1 to 10 W/mK. This allows the heat radiation of the power module to be enhanced more reliably.

Furthermore, in the power module, at least one semiconductor element can be used as the heat generating component.

Furthermore, in the power module, the heat generating component may be composed of a plurality of heat generating components varying in height.

Furthermore, preferably, in the power module, the thermally conductive and electrically insulating member is brought to the complementary state by being subjected to pressure.

Furthermore, desirably, in the at least one semiconductor element, a heat spreader is provided on a surface opposite a surface connected electrically to the wiring substrate, which is encapsulated with resin in a state where at least a portion of the heat spreader is exposed, and an exposed surface of the heat spreader is bonded to the thermally conductive and electrically insulating member. According to this configuration, heat generated in the semiconductor element is transferred immediately to the heat spreader, and thus the heat can be radiated efficiently in a direction of the thermally conductive and electrically insulating member. In the present invention, the heat spreader refers to a heat diffusing plate.

Furthermore, desirably, the semiconductor element is a semiconductor chip mounted facedown on the wiring substrate, and a rear surface of the semiconductor chip is bonded to the thermally conductive and electrically insulating member. According to this configuration, while heat can be radiated from the rear surface of the semiconductor chip, high-density mounting can be achieved since the semiconductor chip is mounted facedown. Further, power loss is reduced compared with the case of mounting by the wire bonding method, and an amount of heat to be generated also can be reduced.

Furthermore, desirably, the semiconductor element is a semiconductor chip mounted facedown on the wiring substrate, and a rear electrode of the semiconductor chip is connected electrically to the wiring substrate through the medium of a metallic conductor. According to this configuration, while heat can be radiated from the rear surface of the semiconductor chip, high-density mounting can be achieved since the semiconductor chip is mounted facedown. Further, power loss is reduced compared with the case of mounting by the wire bonding method, and an amount of heat to be generated also can be reduced.

Furthermore, in the power module using the semiconductor chip, desirably, a portion between the semiconductor chip mounted facedown and the wiring substrate is encapsulated with resin. This configuration allows the reliability of electrical connection between the semiconductor chip and the wiring substrate to be enhanced. Further, this serves to reinforce the fixing of the semiconductor chip onto the wiring substrate.

As the semiconductor chip, a semiconductor in which an electric current flows in a thickness direction of the chip can be used. Such semiconductors include a silicon semiconductor such as an IGBT (isolate gate bipolar transistor) and a MOS-FET (metal oxide semiconductor field-effect transistor), and a single crystal SiC semiconductor of a silicon carbide semiconductor.

Furthermore, in the power module, desirably, the heat sink is made of aluminum or copper. This is desirable because these metals are excellent in thermal conduction. Particularly, copper has an excellent thermal conduction property, thereby achieving excellent heat radiation. Further, aluminum is lightweight and inexpensive and further presents excellent processability, and thus the heat sink can be formed into a complicated shape so as to be increased in surface area, thereby achieving excellent heat radiation.

Furthermore, in the power module, desirably, the heat sink is fixed to the wiring substrate using a fixing tool. According to this configuration, the heat sink bonded at least to the heat generating component by means of the thermally conductive and electrically insulating member can be fixed more firmly.

Furthermore, in the power module, desirably, the heat sink includes a concave portion, and at least the heat generating component is housed in the concave portion through the medium of the thermally conductive and electrically insulating member. According to this configuration, the thermally conductive and electrically insulating member can be controlled so as to be disposed in an inner portion of the concave portion of the heat sink, thereby allowing the manufacturing process to be made easier.

Furthermore, in the power module, desirably, the heat sink is provided with a radiating fin. This allows heat radiation efficiency to be improved more reliably.

Next, in the manufacturing method according to the present invention, under the heat treatment, the thermoplastic resin powder is swelled by absorbing the liquid component, so that the thermally conductive and electrically insulating member in the uncured state is increased in viscosity to be solidified irreversibly. In this manner, the heat sink is fixed with respect to the heat generating component. Then, the thermally conductive and electrically insulating member can be cured by heating. Thus, the thermally conductive and electrically insulating member can be tested for the adhesion to the heat generating component and the heat sink while being solidified in the uncured state before being cured.

Furthermore, the thermally conductive and electrically insulating member also can be cured in the following manner. The thermally conductive and electrically insulating member in the uncured state disposed on the heat sink is subjected to a heat treatment before being bonded to the heat generating component. Under the heat treatment, the thermoplastic resin powder is swelled by absorbing the liquid component, so that the thermally conductive and electrically insulating member is increased in viscosity to be solidified irreversibly. Then, the thermally conductive and electrically insulating member is bonded in such a manner as to be deformed complementarily to unevenness in shape and height of the heat generating component. After that, the thermally conductive and electrically insulating member can be cured by heating. Thus, even when the thermally conductive and electrically insulating member in the uncured state has high flowability, the thermoplastic resin powder is swelled to increase viscosity, and thus the thermally conductive and electrically insulating member can be prevented from being leaked excessively in a process of being bonded to the heat generating component.

Furthermore, the thermally conductive and electrically insulating member also can be cured in the following manner. The thermally conductive resin composition formed of the inorganic filler and the insulative resin containing at least the thermosetting resin that is in the liquid state at room temperature, the thermoplastic resin powder, and the latent curing agent is used as the thermally conductive and electrically insulating member in the uncured state and disposed on each of the heat generating components so as to be bonded to the heat sink. Then, under a heat treatment, the thermoplastic resin powder is swelled by absorbing the liquid component, so that the thermally conductive and electrically insulating member in the uncured state is increased in viscosity to be solidified irreversibly. In this manner, the heat sink is fixed with respect to the heat generating components. Then, the thermally conductive and electrically insulating member can be cured by heating. Thus, the thermally conductive and electrically insulating member can be tested for the adhesion to each of the heat generating components and the heat sink, while being solidified in the uncured state before being cured.

In the method of manufacturing a power module, desirably, the step of mounting the heat generating component on the wiring substrate is a step in which after a semiconductor chip is mounted facedown, an encapsulating resin is injected between a wiring pattern on the wiring substrate and the semiconductor chip and cured. This allows the fixing of the semiconductor chip mounted facedown onto the wiring substrate to be reinforced by the encapsulating resin, thereby making it easy to perform the step of allowing the thermally conductive and electrically insulating member in the uncured state to be bonded to the heat generating component or the heat sink.

Furthermore, in the method of manufacturing a power module, desirably, the step of disposing the thermally conductive and electrically insulating member in the uncured state on the heat sink, which is formed of the thermally conductive resin composition, is a step of applying a paste-like material of the thermally conductive resin composition. This allows the thermally conductive and electrically insulating member to be filled with a high concentration of the inorganic filler, thereby allowing the power module to be excellent in heat radiation. Further, the power module can be formed using simple equipment.

Furthermore, in the method of manufacturing a power module, desirably, the step of disposing the thermally conductive and electrically insulating member in the uncured state on the heat sink, which is formed of the thermally conductive resin composition, is a step in which a sheet-like material of the thermally conductive resin composition having flexibility in the uncured state is laminated on the heat sink. This allows the thermally conductive and electrically insulating member to be filled with a high concentration of the inorganic filler, thereby allowing the power module to be excellent in heat radiation. Further, the thermally conductive and electrically insulating member easily can be disposed on the heat sink.

Furthermore, in the method of manufacturing a power module, the step of allowing the thermoplastic resin powder to be swelled and solidified under the heat treatment is performed at a temperature of, preferably 70 to 130° C., and more preferably 70 to 110° C. This allows the swelling of the thermoplastic resin powder to be accelerated while the thermally conductive and electrically insulating member is in the uncured state.

Furthermore, in the method of manufacturing a power module, desirably, the step of allowing the heat generating component and the thermally conductive and electrically insulating member to be bonded to each other and/or the step of allowing the thermally conductive and electrically insulating member to be cured by heating are/is performed under a pressure of not less than 0.1 Mpa and not more than 200 Mpa. This allows the thermally conductive and electrically insulating member to be bonded to the heat generating component or the heat sink with reliability. Further, voids in the thermally conductive and electrically insulating member, which lead to a decrease in dielectric strength, can be reduced.

Furthermore, in the method of manufacturing a power module, desirably, during a series of the steps, i.e. from the step of disposing the thermally conductive and electrically insulating member to the step of allowing the thermally conductive and electrically insulating member to be cured, or immediately after performing the step of allowing the heat generating component and the thermally conductive and electrically insulating member to be bonded to each other, a step of subjecting a formed body to a reduced pressure is added. This allows voids in the thermally conductive and electrically insulating member, which lead to a decrease in dielectric strength, to be reduced.

Furthermore, in the method of manufacturing a power module, desirably, the step of allowing the thermally conductive and electrically insulating member to be cured by heating is performed at a temperature of 130 to 260° C. This allows the thermosetting resin constituting the thermally conductive and electrically insulating member to be cured in a short time.

Furthermore, in the method of manufacturing a power module, desirably, before or after the step of allowing the thermally conductive and electrically insulating member to be cured by heating, a step of fixing the heat sink to the wiring substrate using a fixing tool is added. This allows the heat sink to be fixed more firmly, which is bonded at least to the heat generating component by means of the thermally conductive and electrically insulating member.

In this case, it also is effective to perform the step of allowing the heat generating component and the thermally conductive and electrically insulating member to be bonded to each other concurrently with the step of fixing the heat sink to the wiring substrate using the fixing tool. This allows the heat sink to be disposed reliably with respect to the heat generating component, and a manufacturing process can be made easier.

Furthermore, in the method of manufacturing a power module, the following also is effective. That is, instead of the step of allowing the thermally conductive and electrically insulating member to be cured by heating, a step of testing the thermally conductive and electrically insulating member that is solidified in the uncured state for the adhesion to the heat generating component or the heat sink and a step of removing the thermally conductive and electrically insulating member are performed. Then, starting again from the step of disposing the thermally conductive and electrically insulating member in the uncured state, the step of allowing the thermally conductive and electrically insulating member to be cured by heating is performed. This repairing process allows the manufacturing yield of the power module according to the present invention to be increased.

Next, the power module of the second configuration according to the present invention is effective as a component used to fabricate the power module of the first configuration.

The power module according to the present invention has a basic configuration in which, to a rear surface of the heat generating component connected electrically to the wiring substrate, the thermally conductive and electrically insulating member filled with a high concentration of the inorganic filler is bonded evenly regardless of variations in height of the heat generating component and connected thermally to the heat sink bonded to an opposite surface.

Hereinafter, the present invention will be described by way of embodiments with reference to appended drawings.

(EMBODIMENT 1)

FIG. 1 is a cross-sectional view for showing a configuration of a power module according to Embodiment 1 of the present invention. As shown in FIG. 1, the power module includes a wiring substrate 103 to which heat generating components 101 are connected electrically and a heat sink 105 connected thermally to the heat generating components through the medium of a thermally conductive and electrically insulating member 104. The thermally conductive and electrically insulating member is bonded to the heat generating components in such a manner as to be deformed complementarily to unevenness in shape and height of the heat generating components.

Figure 2:
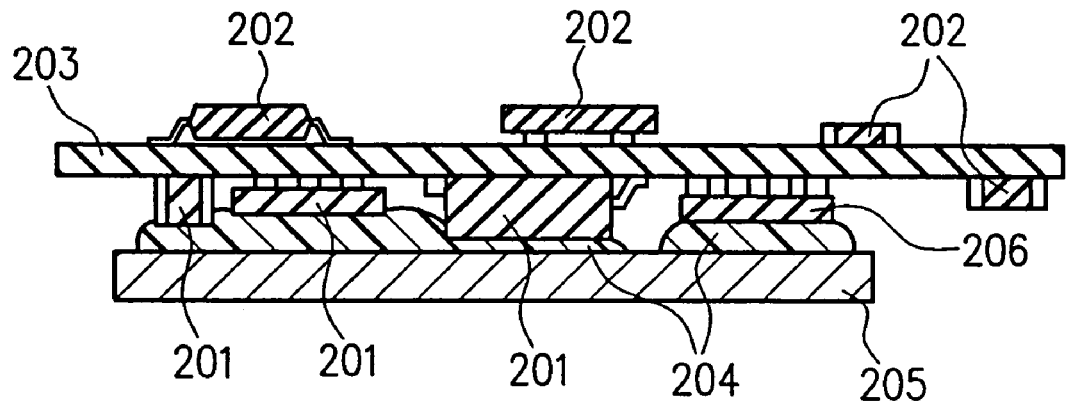
FIG. 2 is a cross-sectional view of the power module according to Embodiment 1 of the present invention.
Figure 3:
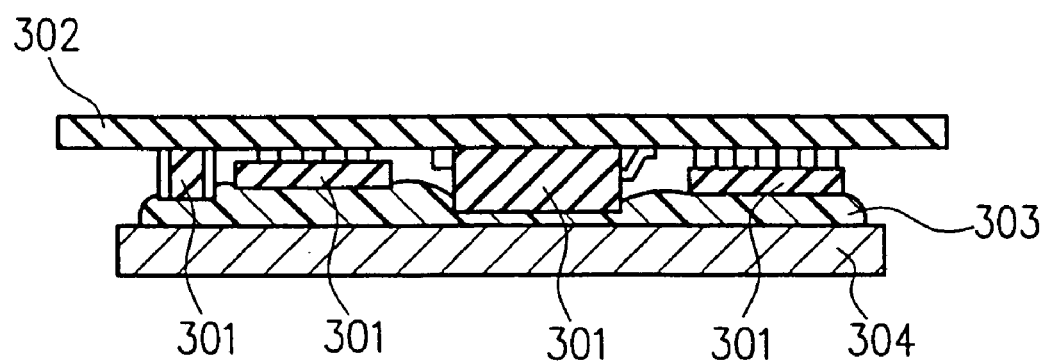
FIG. 3 is a cross-sectional view of the power module according to Embodiment 1 of the present invention.
Figure 4:
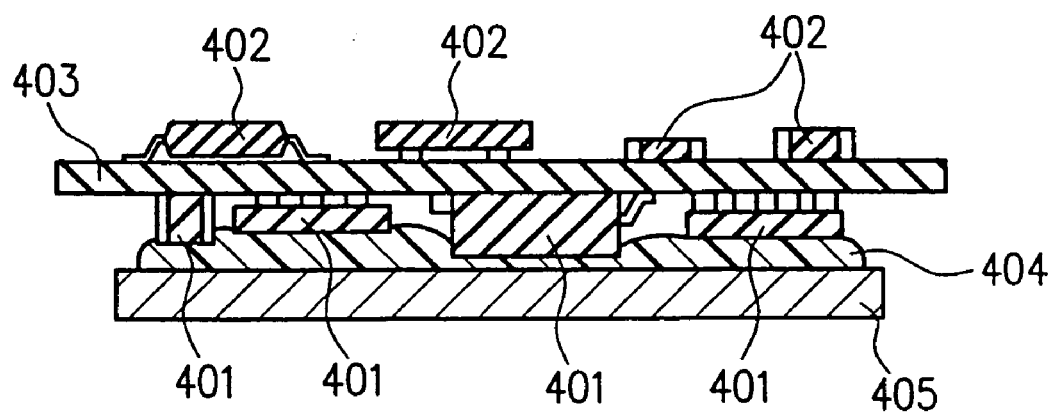
FIG. 4 a cross-sectional view of the power module according to Embodiment 1 of the present invention.

The thermally conductive and electrically insulating member 104 is a layer formed by allowing an inorganic filler to be dispersed in an insulative resin. The thermal conductivity, the coefficient of linear thermal expansion, the dielectric constant, or the like of the thermally conductive and electrically insulating member can be regulated by selecting the insulative resin and the inorganic filler. Preferably, the thermal conductively falls within a range of 1 to 10 W/mk, thereby allowing the power module to be excellent in heat radiation. FIG. 1 shows a preferable configuration in which a plurality of the heat generating components are connected thermally to the heat sink through the medium of the common thermally conductive and electrically insulating member. However, as shown in FIG. 2, the thermally conductive and electrically insulating member may be bonded to the single heat generating component. In FIG. 2, heat generating components 201 and 206 and non-heat generating components 202 are mounted on a wiring substrate 203. The heat generating components 201 and the heat generating component 206 are connected thermally to one heat sink 205 through the media of different thermally conductive and electrically insulating members 204, respectively. Further, FIG. 1 shows a preferable configuration in which non-heat generating components 102 as well as the heat generating components are mounted on the wiring substrate. However, as shown in FIG. 3, a configuration may be employed in which only heat generating components 301 are mounted on a wiring substrate 302 and connected thermally to a heat sink 304 through the medium of a thermally conductive and electrically insulating member 303. In a more preferable configuration, as shown in FIG. 4, on one main surface of a wiring substrate 403, heat generating components 401 are mounted and bonded to a heat sink 405 and a thermally conductive and electrically insulating member 404, and on a surface opposite the one main surface, non-heat generating components 402 are mounted. This configuration is preferable because even when the non-heat generating components are extremely susceptible to heat, the function of the non-heat generating components is not impaired by heat from the heat generating components.

In the power modules with the aforementioned configurations, the heat generating components can be mounted with high density on the wiring substrate on which microscopic wiring is formed, and heat generated from the heat generating component is radiated immediately from the heat sink through the medium of the thermally conductive and electrically insulating member bonded to the heat generating component and the heat sink. Further, the thermally conductive and electrically insulating member is deformed complementarily so as to absorb unevenness in height, dimensional tolerances, and variations in mounting posture with respect to the wiring substrate of the heat generating components mounted on the wiring substrate, and thus heat generated from each of the heat generating components can be radiated evenly and efficiently regardless of variations in height of the components. Further, the thermally conductive and electrically insulating member is bonded to the heat generating component and the heat sink, thereby providing a low contact thermal resistance and high heat radiation efficiency. Thus, a power circuit portion including the heat generating components and a control circuit portion including the non-heat generating components can be integrated and mounted with high density on the same wiring substrate, thereby allowing the power module to be reduced further in size. Further, the thermally conductive and electrically insulating member is bonded by itself, thereby eliminating the need for an external force for bonding the member to the heat generating component, and thus no stress is caused with respect to the heat generating components. Thus, the power module further is increased in reliability.

(EMBODIMENT 2)

FIG. 5 is a cross-sectional view for showing a configuration of a power module according to Embodiment 2 of the present invention. In Embodiment 2, another embodiment of the power module according to the present invention will be explained. The same materials as those described with regard to Embodiment 1 are used except where particularly noted, and constituent members under the same designations have the same functions.

Figure 5A:
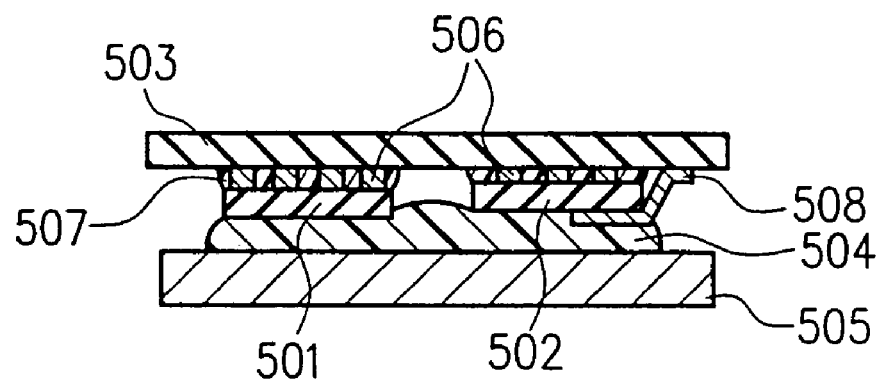
FIGS. 5A to 5B are cross-sectional views of a power module according to Embodiment 2 of the present invention.
Figure 5B:
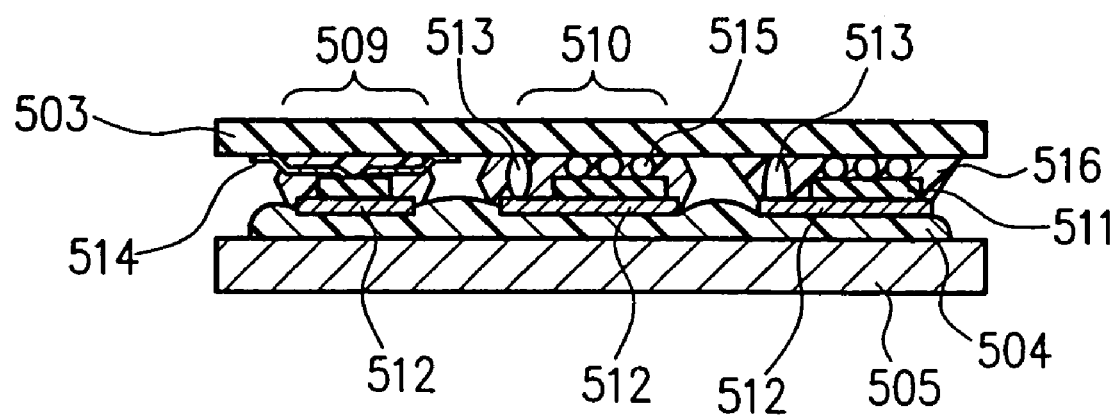

FIGS. 5A to 5B show a preferable configuration of the power module according to the present invention, in which a semiconductor element is used as the heat generating component. There is no particular limit to the semiconductor element, and for example, an IGBT, a MOS-FET, a transistor, a diode, an IC (integrated circuit), a LSI (large scale integration), or the like is used. In FIG. 5A, a semiconductor chip (heat generating component) 501 is a bare chip that is mounted facedown on a wiring substrate 503, and a rear surface of the semiconductor chip 501 is bonded to a thermally conductive and electrically insulating member 504. According to this configuration, while heat is radiated from the rear surface of the semiconductor chip to a heat sink 505, high-density mounting can be achieved since the semiconductor chip is mounted facedown. Further, power loss can be reduced compared with the case of mounting by the wire bonding method, and an amount of heat to be generated can be reduced. A method of mounting the semiconductor chip facedown is not limited particularly, and various known methods can be employed. For example, the following methods are effective: a method in which a metallic bump 506 formed on a surface of an electrode of the semiconductor chip and an electrode on the wiring substrate are bonded through the medium of solder or a conductive adhesive; and a method in which in a state where the semiconductor chip on which the metallic bump is formed is mounted facedown, the metallic bump and the electrode on the wiring substrate are bonded directly to each other by heating and pressing or applying an ultrasonic wave. In this case, preferably, a portion in which the semiconductor chip and a wiring pattern are connected is encapsulated with a resin 507. An encapsulating process is not necessarily required. However, the encapsulating process serves to reinforce the mechanism so that malfunctioning in electrical connection is not caused in the succeeding processes, thereby being effective in terms of workability.

Furthermore, in FIG. 5A, to a rear surface of a semiconductor chip (heat generating component) 502 mounted facedown, a metallic conductor 508 further is connected, so that the semiconductor chip 502 is connected electrically to the wiring substrate. Generally, power semiconductors using a silicon semiconductor and a single crystal SiC semiconductor such as an IGBT and a MOS-FET have a configuration in which an electric current flows in a thickness direction of a chip so as to cope with a large current. Preferably, a configuration of the semiconductor chip 502 shown in FIG. 5A is used so that an electric current from the rear surface is extracted through the medium of the metallic conductor. Preferably, the metallic conductor is formed of at least one metal selected from the group consisting of copper, aluminum, nickel, and iron. This is preferable because these metals have high electrical conductivity and present low resistance loss even when a large current is passed. Particularly, copper has an excellent thermal conduction property as well as excellent electrical conductively, thereby being advantageous in enhancing heat radiation.

Furthermore, in FIG. 5B, on a rear surface of a semiconductor element (heat generating component) 509, a heat spreader 512 is provided by being encapsulated with resin so that at least a portion of the heat spreader 512 is exposed, and at least an exposed surface of the heat spreader is bonded to the thermally conductive and electrically insulating member 504. This configuration is preferable because heat generated in the semiconductor element can be transferred immediately to the heat spreader and radiated efficiently in a direction of the thermally conductive and electrically insulating member. On a rear surface of a semiconductor element (heat generating component) 510, the heat spreader 512 also is provided. In the semiconductor element 510, a semiconductor chip with a configuration in which an electric current flows in a thickness direction is used. It is also possible to form an extraction electrode 513 on a side of the wiring substrate of the heat spreader so that the extraction electrode 513 is used as a conductor for extracting an electric current from the rear surface of the semiconductor chip. The semiconductor elements 509 and 510 are packaged as surface-mounted components. In each of the semiconductor elements 509 and 510, an extraction electrode is provided in a direction from an electrode-forming surface of a build-in semiconductor chip to the exterior of a package. There is no particular limit to the extraction electrode. Preferably, the extraction electrode is a metallic bump formed of at least one metal selected from the group consisting of copper, aluminum, nickel, iron, and gold such as a lead frame 514 and a metallic ball 515. The extraction electrode 513 for extracting an electric current from the rear surface of the semiconductor chip, which is formed on the heat spreader, may be formed from the same material as that of the extraction electrode for extracting an electric current from the electrode-forming surface. Alternatively, as the extraction electrode 513, a projection can be formed on the heat spreader to the side of the wiring substrate by deep drawing.

While the semiconductor elements 509 and 510 are packaged and mounted as the surface-mounted components, the following configuration also is preferable. That is, a semiconductor chip (heat generating component) 511 with a rear surface on which the heat spreader 512 is provided is mounted on the wiring substrate. Then, a portion between the heat spreader 512 and the wiring substrate 503 including the semiconductor chip is encapsulated with a resin 516 so that at least a portion of the heat spreader 512 is exposed. This configuration is highly reliable because a portion in which the semiconductor chip and a wiring pattern are connected and the semiconductor chip itself are encapsulated.

Preferably, the heat spreader is formed of at least one metal selected from the group consisting of copper, aluminum, nickel, and iron. More preferably, the heat spreader is formed of copper excellent in electrical conductivity and thermal conduction property. Preferably, a surface of the heat spreader on which the heat spreader is bonded to the thermally conductive and electrically insulating member is roughened. This can enhance adhesion. Roughening can be performed either chemically or physically. As a chemical method, for example, the heat spreader is immersed in an aqueous solution of iron chloride, copper chloride, or the like and subjected to etching. Further, as a physical method, for example, a powder of aluminum oxide or the like is sprayed on the surface with compressed air.

(EMBODIMENT 3)

FIGS. 6A to 6D are cross-sectional views for showing process steps in a method of manufacturing a power module according to Embodiment 3 of the present invention. In Embodiment 3, an embodiment of a method of manufacturing the semiconductor device shown in FIG. 4 will be explained. The same materials as those described with regard to each of the aforementioned embodiments are used except where particularly noted, and constituent members and manufacturing methods under the same designations have the same functions.

Figure 6A:
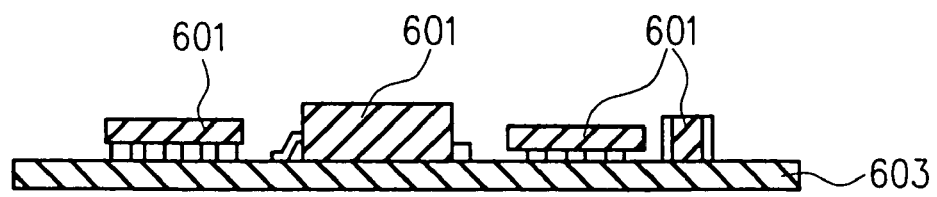
FIGS. 6A to 6D are cross-sectional views for showing process steps in a method of manufacturing a power module according to Embodiment 3 of the present invention.

In FIG. 6A, heat generating components 601 are mounted on a wiring substrate 603. There is no particular limit to a method of mounting the heat generating components 601, and various known methods can be employed. For example, with respect to a surface-mounted component, a method is employed in which solder and a conductive adhesive are used, and with respect to a semiconductor chip, a method is employed in which the semiconductor chip is mounted facedown as described with regard to Embodiment 2. Although in FIGS. 6A to 6D, an encapsulating resin is omitted that is provided in a portion in which the semiconductor chip and a wiring pattern are connected, preferably, the portion is encapsulated. In this case, after the semiconductor chip is mounted facedown, the resin is injected in a desired portion to be cured.

The wiring substrate is not limited to a dual-sided wiring substrate shown in FIG. 6A and may be of a multilayer wiring substrate. In the figures, the wiring pattern formed on a surface of the wiring substrate is omitted. Next, on one main surface of a heat sink 605, a thermally conductive and electrically insulating member 604 in an uncured state is provided. The thermally conductive and electrically insulating member is a thermally conductive resin composition containing at least an inorganic filler and an insulative resin.

Figure 6B:
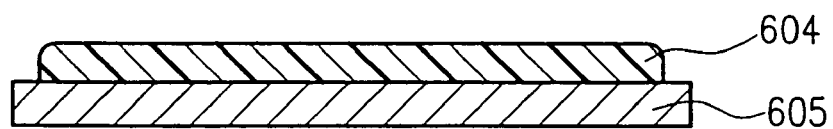

In FIG. 6B, the thermally conductive resin composition formed by kneading the above inorganic filler and the insulative resin is disposed on the one main surface of the heat sink 605 as the thermally conductive and electrically insulating member 604 in the uncured state. Preferably, the thermally conductive resin composition is disposed in such a simple manner that the thermally conductive resin composition in the form of a paste-like material having a proper viscosity is applied. The thermally conductive resin composition in the form of the paste-like material can be applied by, for example, metal mask printing. Further, the following method also is preferable in terms of handling ease. That is, the thermally conductive resin composition disposed on a mold release film is formed into a sheet, and the sheet is laminated on the heat sink. The sheet can be formed by extrusion molding or the like.

As the heat sink 605, preferably, an aluminum plate and a copper plate that are excellent in thermal conductivity are used. More preferably, a plate provided with a radiating fin is used. Particularly, aluminum is excellent in processability, and thus the heat sink can be of a complicated shape so as to have an increased surface area, thereby achieving excellent heat radiation. Further, in terms of the adhesion of a surface of the heat sink to the thermally conductive and electrically insulating member, it is preferable that the surface is roughened in advance in the same manner as in the case of roughening the surface of the heat spreader described with regard to Embodiment 2.

Figure 6C:
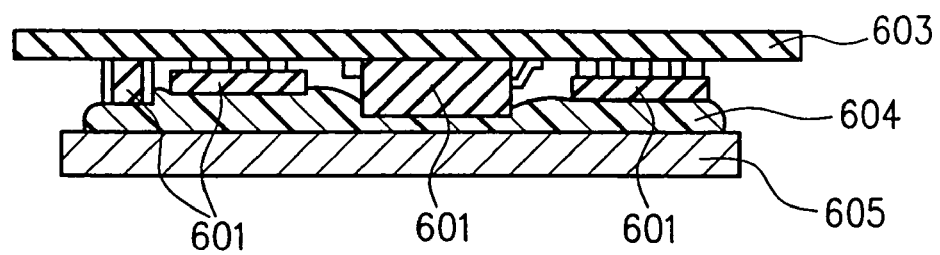

Next, in FIG. 6C, the thermally conductive and electrically insulating member 604 in the uncured state disposed on the heat sink 605 is pressed against a surface of each of the heat generating components 601 mounted on the wiring substrate 603 opposite a surface connected electrically to the wiring substrate. Thus, the thermally conductive and electrically insulating member is bonded in such a manner as to be deformed complementarily to unevenness in shape and height of the heat generating components. Preferably, this process is performed under a pressure of not less than 0.1 Mpa and not more than 20 Mpa so that the adhesion of the thermally conductive and electrically insulating member to the heat generating components or the heat sink is ensured.

Then, a formed body is subjected to a heat treatment at a temperature in the aforementioned preferable range of 70 to 110° C. Under the heat treatment, a thermoplastic resin powder is swelled by absorbing a liquid component contained in the insulative resin, so that the thermally conductive and electrically insulating member in the uncured state is increased in viscosity to be solidified irreversibly. In this manner, the heat sink is fixed with respect to the heat generating components. The thermally conductive and electrically insulating member is in the uncured state while being solidified, and thus at this stage, the thermally conductive and electrically insulating member can be tested for the adhesion to the heat generating components or the heat sink. When there is a defect in the adhesion, the thermally conductive and electrically insulating member can be removed easily. This allows the manufacturing yield of the power module according to the present invention to be increased.

After that, the formed body is heated so that the thermally conductive and electrically insulating member is cured. The heating process is performed at a temperature higher than a curing temperature of a thermosetting resin contained in the thermally conductive and electrically insulating member, i.e. generally of 130 to 260° C., and preferably of 170 to 230° C. Preferably, this heating process also is performed under a pressure of not less than 0.1 Mpa and not more than 20 Mpa. This is preferable because under the pressure, voids in the thermally conductive and electrically insulating member, which lead to a decrease in dielectric strength, can be reduced. It also is effective in reducing the voids to subject the formed body to a reduced pressure during the steps of disposing the thermally conductive and electrically insulating member and allowing the member to be cured, or immediately after the step of allowing the heat generating components and the thermally conductive and electrically insulating member to be bonded to each other.

In this embodiment as a desirable embodiment, the thermoplastic resin powder is swelled by absorbing the liquid component under the heat treatment, and thus at one stage, the thermally conductive and electrically insulating member in the uncured state is solidified, so that the above repairing process of the thermally conductive and electrically insulating member is made possible. However, the same formed body also can be obtained in the following manner. That is, the thermally conductive and electrically insulating member in the uncured state being bonded to the heat generating components and the heat sink is heated to be cured at a single stroke. In this case, the insulative resin constituting the thermally conductive resin composition is not necessarily required to contain the thermoplastic resin powder, and thus a composition containing at least the thermosetting resin that is in a liquid state at room temperature and a latent curing agent also can be used.

In this manner, as shown in FIG. 6C, the power module housing only the heat generating components as described with regard to Embodiment 1 and shown in FIG. 3 is provided. In the power module, the thermally conductive and electrically insulating member is cured to be bonded to the heat generating components and the heat sink.

Figure 6D:
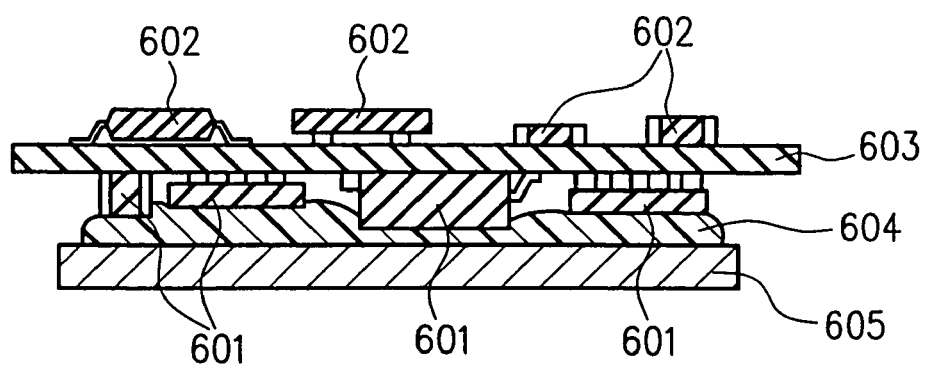

Next, in FIG. 6D, on a surface of the wiring substrate 603 opposite the surface on which the heat generating components are mounted, non-heat generating components 602 are mounted by various known methods. In this manner, the power module described with regard to Embodiment 1 and shown in FIG. 4 can be fabricated. When an area in which the non-heat generating components are mounted is not limited to the surface of the wiring substrate opposite the surface on which the heat generating components are mounted, the power module described with regard to Embodiment 1 and shown in FIG. 1 can be fabricated. In the above embodiment, the same power module also can be fabricated by performing each process using a wiring substrate on which non-heat generating components as well as heat generating components are mounted in advance.

(EMBODIMENT 4)

Figure 7A:
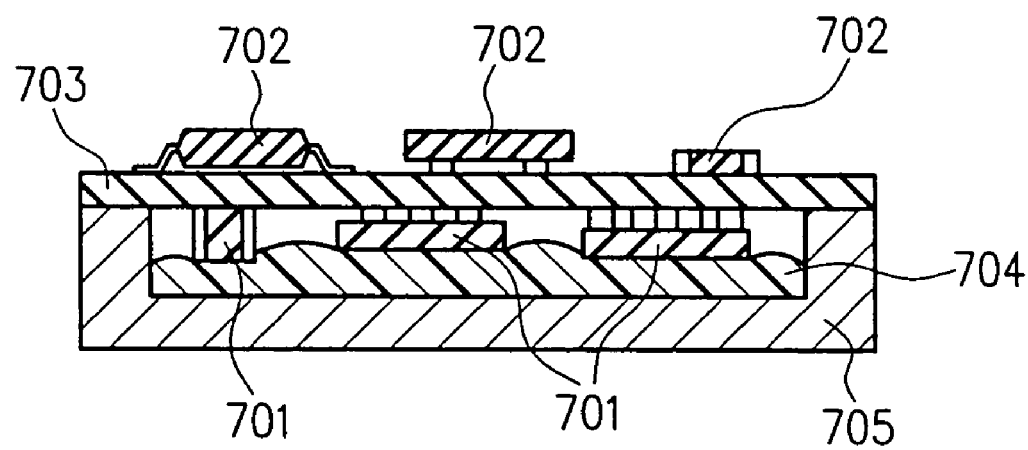
FIGS. 7A to 7B are cross-sectional views of a power module according to Embodiment 4 of the present invention.
Figure 7B:
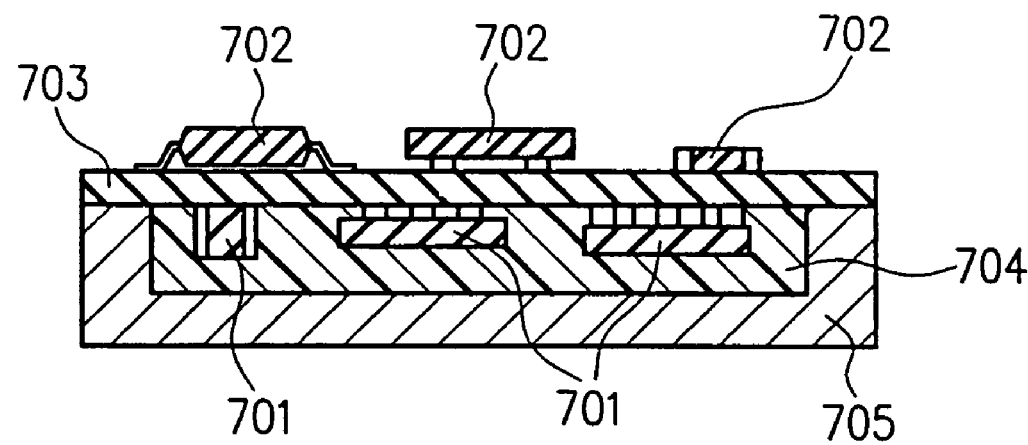

FIGS. 7A to 7B are cross-sectional views for showing a configuration of a power module according to Embodiment 4 of the present invention. In Embodiment 4, another embodiment of the power module according to the present invention will be explained. The same materials as those described with regard to each of the aforementioned embodiments are used except where particularly noted, and constituent members and manufacturing methods under the same designations have the same functions.

FIGS. 7A to 7B show examples of a possible and preferable configuration of a heat sink in the power module according to the present invention. FIG. 7A shows substantially the same configuration as that shown in FIG. 4. Heat generating components 701 and non-heat generating components 702 are mounted on a wiring substrate 703. Each of the heat generating components 701 is connected thermally to a heat sink 705 through the medium of a thermally conductive and electrically insulating member 704. However, in this configuration, the heat sink includes a concave portion in which the heat generating components are housed through the medium of the thermally conductive and electrically insulating member. According to this configuration, the thermally conductive and electrically insulating member in an uncured state is limited to be disposed in the concave portion of the heat sink, and thus excessive resin flow can be prevented, and sufficient pressure can be obtained when the thermally conductive and electrically insulating member is bonded. Thus, the manufacturing process of the power module according to the present invention is made easier. In the concave portion of the heat sink, the non-heat generating components also may be housed. Further, in FIG. 7A, the heat sink 705 and the wiring substrate 703 are in contact with each other. However, the present invention is not limited thereto, and other configurations also are conceivable. For example, the heat sink and the wiring substrate may not be in contact with each other, or an area in which the heat sink and the wiring substrate are in contact with each other may be fixed using a fixing tool such as a screw.

As shown in FIG. 7B, the heat generating components 701 and the non-heat generating components 702 may be encapsulated with the thermally conductive and electrically insulating member 704.

(EMBODIMENT 5)

FIG. 8A to 8D are cross-sectional views for showing process steps in a method of manufacturing a power module according to Embodiment 5 of the present invention. In Embodiment 5, an embodiment of the power module according to the present invention and the method of manufacturing the power module will be explained. The same materials as those described with regard to each of the aforementioned embodiments are used except where particularly noted, and constituent members and manufacturing methods under the same designations have the same functions.

Figure 8A:
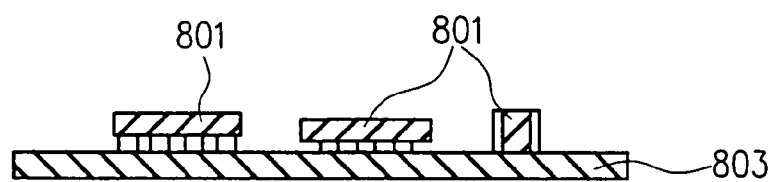
FIGS. 8A to 8D are cross-sectional views for showing process steps in a method of manufacturing a power module according to Embodiment 5 of the present invention.

In FIG. 8A, heat generating components 801 are mounted on a wiring substrate 803.

Figure 8B:
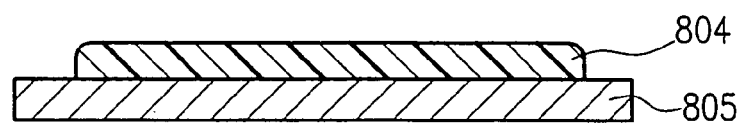

Next, as shown in FIG. 8B, a thermally conductive and electrically insulating member 804 in an uncured state is disposed on one main surface of a heat sink 805. The thermally conductive and electrically insulating member has the same configuration as that described with regard to Embodiment 3 and is a thermally conductive resin composition containing at least an inorganic filler and an insulative resin. The insulative resin constituting the thermally conductive resin composition contains a thermosetting resin that is in a liquid state at room temperature as a main component and at least a thermoplastic resin and a latent curing agent. In the insulative resin in an uncured state, the thermoplastic resin is a thermoplastic resin powder.

Furthermore, in this embodiment, at this stage, the thermally conductive and electrically insulating member is subjected to a heat treatment at a temperature in a preferable range of 70 to 110° C. Under the heat treatment, the thermoplastic resin powder is swelled by absorbing a liquid component contained in the insulative resin, so that the thermally conductive and electrically insulating member in the uncured state is increased in viscosity to be solidified irreversibly.

Figure 8C:
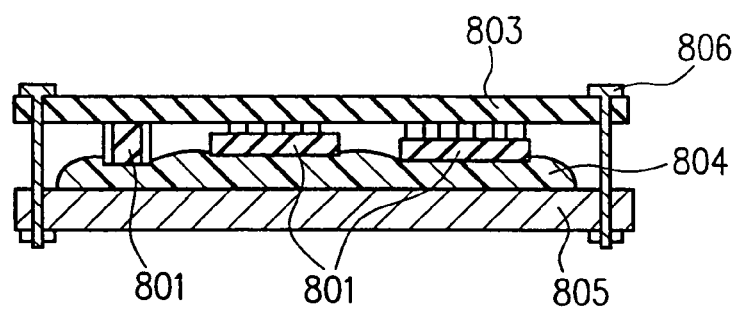

Next, as shown in FIG. 8C, the thermally conductive and electrically insulating member 804 that is solidified while being in the uncured state and disposed on the heat sink 805 is pressed against a surface of each of the heat generating components 801 mounted on the wiring substrate 803 opposite a surface connected electrically to the wiring substrate. In this manner, the thermally conductive and electrically insulating member is bonded in such a manner as to be deformed complementarily to unevenness in shape and height of the heat generating components. Preferably, this process is performed under a pressure of not less than 0.1 Mpa and not more than 20 Mpa so as to ensure the adhesion of the thermally conductive and electrically insulating member to the heat generating components or the heat sink. In this embodiment, a pressing process required for the adhesion is performed by fixing the heat sink to the wiring substrate using a fixing tool 806. There is no particular limit to the fixing tool, and a screw, for example, can be used. This fixing process allows the required pressure to be attained. At the same time, the disposition of the heat sink can be ensured with respect to the heat generating components and reinforced so as not to cause a positional shift in succeeding operations, and thus the manufacturing process can be made easier. The thermally conductive and electrically insulating member is increased in viscosity to be solidified as a result of swelling of the thermosetting resin powder. Thus, the thermally conductive and electrically insulating member is in the uncured state and has such flexibility as to be deformed with respect to the heat generating components being pressed against the member. By allowing the thermally conductive and electrically insulating member to be increased in viscosity to be solidified under the heat treatment before being bonded to the heat generating components, the following can be achieved. That is, even when the thermally conductive and electrically insulating member has high flowability, excessive resin flow can be prevented in the step of allowing the member to be bonded, and a sufficient pressure also can be attained when the member is bonded. Further, the thermally conductive and electrically insulating member is in the uncured state while being solidified, and thus at this stage, the thermally conductive and electrically insulating member can be tested for the adhesion to the heat generating components or the heat sink. When there is a defect in the adhesion, the thermally conductive and electrically insulating member can be removed easily. This allows the manufacturing yield of the power module according to the present invention to be increased.

Figure 8D:
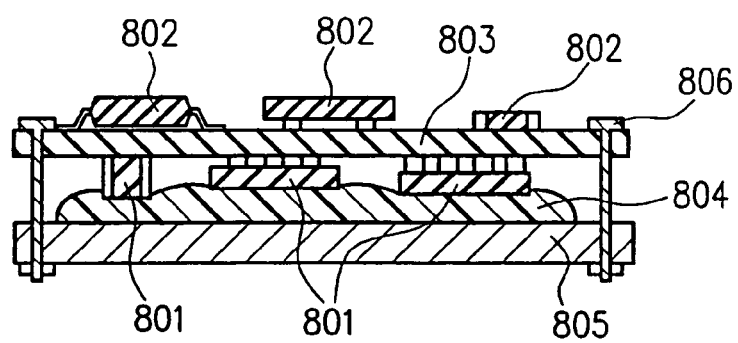

After that, a formed body is heated so that the thermally conductive and electrically insulating member is cured. Further, as shown in FIG. 8D, non-heat generating components 802 are mounted.

In this manner, the power module is provided in which the thermally conductive and electrically insulating member is cured to be bonded to the heat generating components and the heat sink, and the heat sink is fixed to the wiring substrate using the fixing tool. The heat sink may be fixed to the wiring substrate using the fixing tool after the thermally conductive and electrically insulating member is cured. Similarly, in this case, the heat sink bonded at least to the heat generating components by means of the thermally conductive and electrically insulating member is fixed more firmly using the fixing tool, thereby achieving a configuration excellent in impact resistance.

(EMBODIMENT 6)

FIGS. 9A to 9D are cross-sectional views for showing process steps in a method of manufacturing a power module according to Embodiment 6 of the present invention. In Embodiment 6, an embodiment of the power module according to the present invention and a method of manufacturing the power module will be explained. The same materials as those described with regard to each of the aforementioned embodiments except where particularly noted, and constituent members and manufacturing methods under the same designations have the same functions.

Figure 9A:
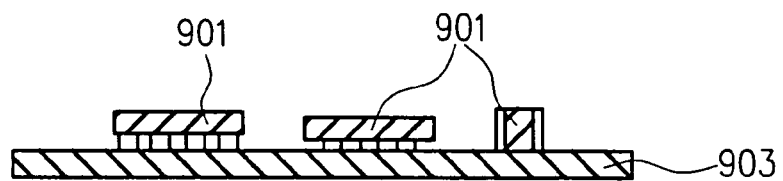
FIGS. 9A to 9D are cross-sectional views for showing process steps in a method of manufacturing a power module according to Embodiment 6 of the present invention.

In FIG. 9A, heat generating components 901 are mounted on a wiring substrate 903.

Figure 9B:
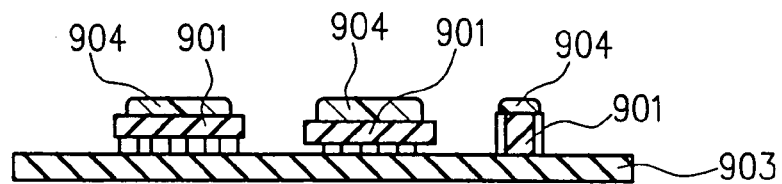

Next, as shown in FIG. 9B, a thermally conductive and electrically insulating member 904 in an uncured state is disposed on each of the heat generating components. The thermally conductive and electrically insulating member has the same configuration as that described with respect to Embodiment 3 and is a thermally conductive resin composition containing at least an inorganic filler and an insulative resin. The insulative resin constituting the thermally conductive resin composition contains a thermosetting resin that is in a liquid state at room temperature as a main component and at least a thermoplastic resin and a latent curing agent. In the insulative resin in an uncured state, the thermoplastic resin is a thermoplastic powder.

Figure 9C:
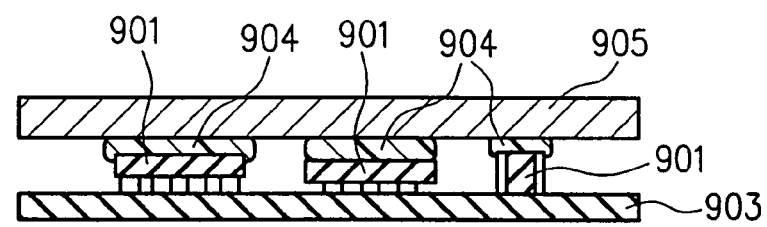

Next, as shown in FIG. 9C, one main surface of a heat sink 905 is pressed against the thermally conductive and electrically insulating member 904 in the uncured state disposed on each of the heat generating components 901. In this manner, the thermally conductive and electrically insulating member is bonded in such a manner as to be deformed complementarily to unevenness in shape and height of the heat generating components. Preferably, this process is performed under a pressure of not less than 0.1 Mpa and not more than 20 Mpa so as to ensure the adhesion of the thermally conductive and electrically insulating member to the heat generating components or the heat sink. Subsequently, a formed body is subjected to a heat treatment at a temperature in a preferable range of 70 to 110° C. Under the heat treatment, the thermoplastic resin powder is swelled by absorbing a liquid component contained in the insulative resin, so that the thermally conductive and electrically insulating member in the uncured state is increased in viscosity to be solidified irreversibly. In this manner, the heat sink is fixed with respect to the heat generating components. The thermally conductive and electrically insulating member is in the uncured state while being solidified, and thus at this stage, the thermally conductive and electrically insulating member is tested for the adhesion to the heat generating components or the heat sink. When there is a defect in the adhesion, the thermally conductive and electrically insulating member can be removed easily. This allows the manufacturing yield of the power module according to the present invention to be increased.

After that, the formed body is heated so that the thermally conductive and electrically insulating member is cured. In this embodiment as a desirable embodiment, the thermoplastic resin powder is swelled by absorbing the liquid component under the heat treatment, and thus at one stage, the thermally conductive and electrically insulating member in the uncured state is solidified, so that the above repairing process of the thermally conductive and electrically insulating member is made possible. However, the same formed body also can be obtained in the following manner. That is, the thermally conductive and electrically insulating member in the uncured state being bonded to the heat generating components and the heat sink is heated to be cured at a single stroke. In this case, the insulative resin constituting the thermally conductive resin composition is not necessarily required to contain the thermoplastic resin powder, and thus a composition containing at least the thermosetting resin that is in the liquid state at room temperature and the latent curing agent also can be used.

Figure 9D:
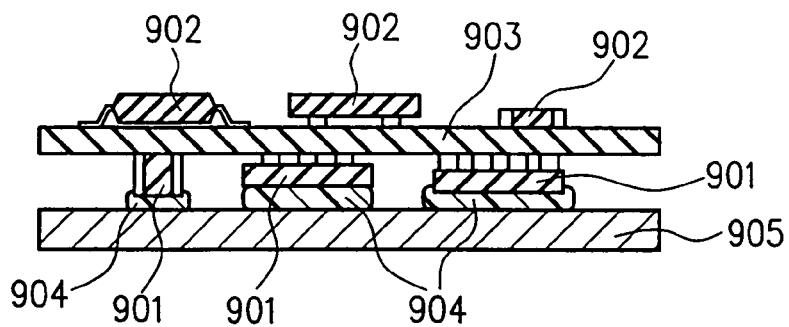

Next, as shown in FIG. 9D, non-heat generating components 902 are mounted.

In this manner, the power module is provided in which the thermally conductive and electrically insulating member is bonded to each of the heat generating components, and the heat generating components with the thermally conductive and electrically insulating member are connected thermally to one heat sink.

According to a configuration of the power module and the method of manufacturing the power module according to this embodiment, an amount of the thermally conductive and electrically insulating member can be reduced, thereby allowing the power module according to the present invention to be manufactured at low cost.

Each of the aforementioned embodiments is not intended to limit the present invention thereto. The present invention may be embodied in other forms based on the scope of the invention as indicated by the appended claims.

EXAMPLE

Hereinafter, the present invention will be explained in greater detail by way of examples.

Example 1

As a power module having the same structure as that shown in FIG. 4, an inverter module with an integrated driving circuit was manufactured in the following manner. In the inverter module, electronic components to be mounted were not limited to those shown in FIG. 4 and suitably selected according to a circuit configuration. Initially, a four-layer FR-5 type (manufactured by Matsushita Electronic Components Co., Ltd., trade name, a wiring substrate formed by impregnating a glass fiber fabric with an epoxy resin) on which a wiring pattern was formed was prepared. Next, on one surface of the wiring substrate, electronic components including a heat generating component were mounted to form a power circuit portion. As an example of mounting of the components, a semiconductor chip was mounted facedown on a wiring pattern. As the semiconductor chip, an IGBT (manufactured by Matsushita Electric Industrial Co., Ltd.) of a rated current of 50 A was used. On an electrode of the semiconductor chip, a bump having a diameter of 100 μm and a height of 40 μm was formed by gold plating, and eutectic solder further was printed on the bump. The semiconductor chip was disposed on the wiring pattern, and in a state where the semiconductor chip was fixed, the eutectic solder was melted using a solder reflow device. Then, the electrode of the semiconductor chip and the wiring pattern were connected electrically. Further, a portion between the semiconductor chip and the wiring pattern was encapsulated with a liquid encapsulating resin.

Next, as a heat sink, an aluminum plate of 2.0 mm thickness was prepared, and one surface of the aluminum plate was roughened by sand blasting (a polishing powder: $Al_2O_3$, Morundum A-40 (trade name), manufactured by Showa Denko K.K.). On the roughened surface, a thermally conductive resin composition was printed so that a thermally conductive and electrically insulating member in an uncured state was provided. As the thermally conductive resin composition, a resin composition having the following components was kneaded using a three roll mill to form a viscous liquid (paste) having a viscosity of 300 Pa•s.
(1) Inorganic filler: globular $Al_2O_3$ ("AS-40", manufactured by Showa Denko K.K., 12 μm in average particle diameter) 88 parts by mass
(2) Thermosetting resin: bisphenol A type epoxy resin ("Epicoat 828", manufactured by Yuka Shell Epoxy K.K.) 7.5 parts by mass
(3) Latent curing agent: tertiary amine salt latent curing agent ("Amicure PN-23", manufactured by Ajinomoto Co., Inc.) 1.0 parts by mass
(4) Thermoplastic resin powder: poly (methyl methacrylate) powder 3.0 parts by mass
(5) Additive: Carbon Black (manufactured by Toyo Carbon Co., Ltd.) 0.3 parts by mass
(6) Dispersing agent for dispersing inorganic filler: ("Plysurf F-208F", manufactured by Dai-ichi Kogyo Seiyaku Co., Ltd.) 0.2 parts by mass The thermally conductive resin composition was printed on the heat sink in the following manner. That is, the heat sink was set on a printing stage, and a 2.5-mm thick stainless steel (SUS) metal mask in which a desired portion to be printed was opened was placed over the heat sink so as to be in contact with the heat sink. Then, the thermally conductive resin composition was dripped on the metal mask and printed onto the opening of the mask using a stainless steel SUS plate squeegee. Further, after the metal mask was removed, the heat sink on which the thermally conductive resin component was printed was subjected to a reduced pressure so that voids in an insulating layer were removed. Rear surfaces of the heat generating components mounted on the wiring substrate were pressed against the disposed thermally conductive and electrically insulating member in the uncured state with a pressure of 0.5 MPa. In this manner, the thermally conductive and electrically insulating member was bonded in such a manner as to be deformed complementarily to unevenness in shape and height of the heat generating components. Then, a formed body was kept at a temperature of 100° C. for five minutes. In this process, the thermoplastic resin powder was swelled by absorbing a liquid component contained in an insulative resin, so that the thermally conductive and electrically insulating member in the uncured state was solidified. In this manner, the heat sink was fixed with respect to the heat generating components. In this state, it was checked visually whether there was a defect in the adhesion between the thermally conductive and electrically insulating member and the heat generating components or the heat sink. When there was a defect in the adhesion, the thermally conductive and electrically insulating member was peeled to be removed and manufactured again by the same method. Then, the formed body was heated at a temperature of 175° C. for 60 minutes without being compressed so that the thermosetting resin in the thermally conductive and electrically insulating member was cured to be bonded to the heat generating components and the heat sink. Finally, electronic components were mounted on a surface of the wiring substrate opposite a surface on which the power circuit portion was formed, so that a driving circuit portion was formed.

In the obtained power module, the thermally conductive and electrically insulating member had a thickness from immediately under the heat generating components of a maximum of 2 mm and a minimum of 0.7 mm. By observation using an ultrasonic flaw detector, it was confirmed that there were no voids at an interface between the thermally conductive and electrically insulating member and the heat generating components or the heat sink.

Furthermore, the dielectric strength of the thermally conductive and electrically insulating member was determined, and as a result, a dielectric strength of not less than 10 KV/mm was obtained. The thermal conduction property of the power module was evaluated, and as a result, a thermal resistance of 0.84° C./W was obtained. The thermal resistance was determined in the following manner. The semiconductor chip was supplied with an electric current to generate heat, and a temperature of a rear surface of the heat sink was measured. Using the result of the measurement, the thermal resistance was determined by calculation.

Furthermore, in order to evaluate reliability, a reflow test was performed in which a reflow test performed at a temperature up to 260° C. for 10 seconds was performed 10 times. In the test, in the power module, cracks or the like in appearance were not caused, and even by observation using the ultrasonic flaw detector, failures such as exfoliation were not perceived particularly at the interface between the thermally conductive and electrically insulating member and the heat generating components or the heat sink.

Example 2

A power module having the same structure as that shown in FIG. 7 was manufactured in the following manner. In the power module, as a heat generating component of a power circuit portion to be mounted, a semiconductor element in which the semiconductor chip 511 shown in FIG. 5B was provided with a heat spreader (10 mm in length by 10 mm in width, 2 mm in thickness) was selected. The semiconductor chip 511 was configured so that an electric current was extracted from a rear surface of the semiconductor chip 511. Initially, the heat spreader formed of a copper plate was plated with nickel, and one surface of the heat spreader was soldered to the rear surface of the semiconductor chip. As the semiconductor chip, an IGBT (manufactured by Matsushita Electronic Industrial Co., Ltd.) of a rated current of 50 A was used. Further, to an electrode of the semiconductor chip, a ball electrode formed of a ball-like copper material having an average diameter of 2 mm on which gold plating was applied to form a 1-μm thick layer was connected using an ultrasonic bonding device to form a metallic bump. At the same time, also on the heat spreader in an area surrounding the semiconductor chip, the same ball electrode of a larger size was connected by ultrasonic bonding and allowed to project so as to be used as an extraction electrode. Next, a glass epoxy wiring substrate of a four-layer FR-5 type on which a wiring pattern was formed was prepared. The semiconductor chip and the extraction electrode of the heat spreader were aligned with and bonded on the wiring pattern using the ultrasonic bonding device. Further, a portion between the semiconductor chip and the wiring pattern was encapsulated with a liquid encapsulating resin. Then, a portion between the heat spreader and the wiring substrate including the semiconductor chip was encapsulated with the liquid encapsulating resin so that only one surface of the heat spreader was exposed.

Next, as a heat sink, a 0.5-mm thick aluminum plate provided with a concave portion having a depth of 3.0 mm and a thickness of each wall of 2.0 mm was prepared, and a bottom surface of the concave portion was roughened by sand blasting. On the roughened surface, a thermally conductive resin composition was printed so that a thermally conductive and electrically insulating member in an uncured state was provided. As the thermally conductive resin composition, a resin composition having the following components was kneaded using a three roll mill and used.

(1) Inorganic filler: globular $Al_2O_3$ ("AS-40", manufactured by Showa Denko K.K., 12 μm in average particle diameter) 85 parts by mass
(2) Thermosetting resin: bisphenol F type epoxy resin ("Epicoat 806", manufactured by Yuka Shell Epoxy K.K.) 8.5 parts by mass
(3) Latent curing agent: tertiary amine salt latent curing agent ("Amicure PN-23", manufactured by Ajinomoto Co., Inc.) 1.5 parts by mass
(4) Thermoplastic resin powder: polyethylene powder 4.5 parts by mass
(5) Additive: Carbon Black (manufactured by Toyo Carbon Co., Ltd.) 0.3 parts by mass
(6) Dispersing agent for dispersing inorganic filler: ("Plysurf F-208F", manufactured by Dai-ichi Kogyo Seiyaku Co., Ltd.) 0.2 parts by mass The kneaded thermally conductive resin composition was formed into a 1.0-mm thick sheet by extrusion molding on a mold release film of polyethylene terephthalate (PET) with a surface processed so that mold releasability was obtained. The sheet-like material was cut into a shape of an opening of the concave portion of the heat sink and laminated so that a surface of the sheet was brought into contact with the concave portion of the heat sink. Then, only the mold release film was peeled so that the thermally conductive resin composition was disposed on a bottom surface of the concave portion of the heat sink. After that, a formed body was kept at a temperature of 100° C. for five minutes. In this process, the thermoplastic resin powder was swelled by absorbing a liquid component contained in an insulative resin, so that the thermally conductive and electrically insulating member in the uncured state was solidified. Rear surfaces of the heat generating components mounted on the wiring substrate were pressed against the disposed thermally conductive and electrically insulating member that was solidified while being in the uncured state, so that the concave portion of the heat sink was covered with the wiring substrate. In this manner, the thermally conductive and electrically insulating member was bonded in such a state as to be deformed complementarily to unevenness in shape and height of the heat generating components. According to the above configuration, even when the thermally conductive and electrically insulating member had high flowability, the following could be achieved. That is, the thermally conductive and electrically insulating member was aligned with the concave portion of the heat sink and allowed to be increased in viscosity under a heat treatment before being bonded to the heat generating components. Thus, excessive resin flow could be prevented in a step of allowing the member to be bonded to the heat generating components, and a sufficient pressure also could be attained when the member was bonded. Next, the formed body was heated at a temperature of 175° C. for 60 minutes without being compressed so that the thermosetting resin in the thermally conductive and electrically insulating member was cured to be bonded to the heat generating components and the heat sink. Finally, electronic components were mounted on a surface of the wiring substrate opposite a surface on which the power circuit portion was formed, so that a driving circuit portion was formed.

In the obtained power module, by observation using an ultrasonic flaw detector, it was confirmed that there were no voids at an interface between the thermally conductive and electrically insulating member and the heat generating components or the heat sink.

Furthermore, the dielectric strength of the thermally conductive and electrically insulating member was determined, and as a result, a dielectric strength of not less than 10 KV/mm was obtained. The thermal conduction property of the power module was evaluated, and as a result, a thermal resistance of 0.84° C./W was obtained.

Furthermore, in order to evaluate reliability, after a heat cycle test was performed, the dielectric strength was determined, and as a result, a dielectric strength of not less than 10 KV/mm was obtained. This indicates that no degradation was caused during the test. The heat cycle test was performed in the following manner. After being kept under a low temperature of −55° C. for 30 minutes, the power module was kept at a high temperature of 125° C. for 30 minutes. This series of processes was repeated 1,000 times.

In the power module obtained in this example, on a rear surface of each of the heat generating components connected electrically to the wiring substrate, the thermally conductive and electrically insulating member filled with a high concentration of the inorganic filler was bonded evenly regardless of variations in height of the components, and thus heat generated from the heat generating components was transferred efficiently to the heat sink. Further, the heat generating components could be mounted with high density on the wiring substrate on which microscopic wiring is formed, and heat generated from the heat generating components was radiated immediately from the heat sink through the medium of the thermally conductive and electrically insulating member bonded to the heat generating components and the heat sink. Moreover, the thermally conductive and electrically insulating member was deformed complementarily so as to absorb unevenness in height, dimensional tolerances, and variations in mounting posture with respect to the wiring substrate of the heat generating components mounted on the wiring substrate, and thus heat generated from each of the heat generating components could be radiated evenly and efficiently regardless of variations in height of the components. Further, the thermally conductive and electrically insulating member was bonded to the heat generating components and the heat sink, thereby providing a low contact thermal resistance and high heat radiation efficiency. Thus, the power circuit portion including the heat generating components and a control circuit portion including non-heat generating components could be integrated so as to be mounted with high density on the same wiring substrate, and thus the power module could be reduced further in size. Further, the thermally conductive and electrically insulating member was bonded by itself, thereby eliminating the need for an external force for bonding the thermally conductive and electrically insulating member to the heat generating components, and thus no stress was caused with respect to the heat generating components. Thus, the power module was increased in reliability.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of manufacturing a power module, comprising the steps of:
    mounting electronic components including at least a heat generating component on one main surface of a wiring substrate and at least one non-heat generating component on a surface opposite the one main surface, with at least one non-heat generating component being in a position other than a position immediately opposite to the position of the heat generating component;
    forming a curable composition layer containing (A) a thermosetting resin, (B) a thermoplastic resin, (C) a latent curing agent, and (D) an inorganic filler between a heat sink and the wiring substrate on a side of the heat generating component and pressing at least one of the heat sink and the wiring substrate against the other so that a thermally conductive and electrically insulating member is bonded in such a manner as to be deformed complementarily to unevenness in shape and height of the heat generating component; and subsequently
    forming the thermally conductive and electrically insulating member by allowing the curable composition layer to be cured by heating.

2. The method of manufacturing a power module according to claim 1,
    wherein with respect to a total amount of 100 parts by mass of a combination of (A) the thermosetting resin of not less than 50 parts and not more than 95 parts and (C) the latent curing agent of not less than 5 parts and not more than 50 parts, (B) the thermoplastic resin is contained in an amount of not less than 10 parts and not more than 100 parts; and
    with respect to a total amount of not less than 5 parts by mass and not more than 30 parts by mass of a combination of (A) the thermosetting resin, (B) the thermoplastic resin, and (C) the latent curing agent, (D) the inorganic filler is contained in an amount of not less than 70 parts and not more than 95 parts.

3. The method of manufacturing a power module according to claim 1, wherein the thermosetting resin is in a liquid state at room temperature, and the thermoplastic resin is in a powdery state when the thermosetting resin is in an uncured state.

4. The method of manufacturing a power module according to claim 3, wherein the thermosetting resin that is in the liquid state at room temperature is a liquid epoxy resin.

5. The method of manufacturing a power module according to claim 1, wherein the curable composition containing (A) the thermosetting resin, (B) the thermoplastic resin, (C) the latent curing agent, and (D) the inorganic filler has a property that the viscosity increases steeply in two stages represented by: a first viscosity increasing curve with respect to temperatures equal to or higher than 70° C. and lower than 130° C.; and a second viscosity increasing curve with respect to temperatures equal to or higher than 130° C.

6. The method of manufacturing a power module according to claim 5, wherein The first viscosity increasing curve represents a viscosity increase resulting from the thermoplastic resin powder being swelled by absorbing the liquid component by heating.

7. The method of manufacturing a power module according to claim 1, wherein the curable composition layer is solidified at a temperature equal to or higher than 70° C. and lower than 130° C. and cured at a temperature equal to or higher than 130° C. and equal to or lower than 260° C.

8. The method of manufacturing a power module according to claim 1, wherein the step of mounting the heat generating component on the wiring substrate is a step in which, after a semiconductor chip is mounted facedown, an encapsulating resin is injected between a wiring pattern on the wiring substrate and the semiconductor chip and cured.

9. The method of manufacturing a power module according to claim 1, wherein the curable composition is at least one selected from a paste-like material and a sheet-like material.

10. The method of manufacturing a power module according to claim 1, wherein bonding of the heat sink and the wiring substrate is performed under a pressure of not less than 0.1 Mpa and not more than 200 Mpa.

11. The method of manufacturing a power module according to claim 1, wherein the curable composition layer is cured by heating under a pressure of not less than 0.1 Mpa and not more than 200 Mpa.

12. The method of manufacturing a power module according to claim 1, wherein after bonding of the heat sink and the wiring substrate, a formed body is subjected to an atmosphere of a reduced pressure.

* * * * *

UNITED STATES PATENT AND TRADEMARK OFFICE
CERTIFICATE OF CORRECTION

PATENT NO. : 7,041,535 B2 Page 1 of 1
APPLICATION NO. : 10/758517
DATED : May 9, 2006
INVENTOR(S) : Yamashita et al.

It is certified that error appears in the above-identified patent and that said Letters Patent is hereby corrected as shown below:

Title Page: Item (56) references cited: --Japan 10-173097 6/1998-- should have been included
Column 1, line 5: "now U.S. Pat. No. 6,707,671" should read --now U.S. Pat No. 6,707,671, which application(s) are incorporated herein by reference--
Column 8, line 5: "AiN" should read --A1N--
Column 14, line 25: "conductively" should read --conductivity--
Column 26, line 46(claim 6): "The" should read --the--

Signed and Sealed this

Sixth Day of March, 2007

JON W. DUDAS
*Director of the United States Patent and Trademark Office*